United States Patent [19]

Strickland

[11] Patent Number: 4,905,291
[45] Date of Patent: Feb. 27, 1990

[54] CYBEROPTIC AUDIO LEVEL CONTROL SYSTEM

[75] Inventor: James C. Strickland, Miami, Fla.

[73] Assignee: Rockford Corporation, Tempe, Ariz.

[21] Appl. No.: 291,529

[22] Filed: Dec. 29, 1988

[51] Int. Cl.$^4$ ............................................. H03G 3/00
[52] U.S. Cl. ................................... 381/108; 381/106; 330/59; 250/214 AG
[58] Field of Search ........... 250/210, 214 A, 214 AG; 381/104, 105, 107, 108, 109, 106; 330/59

[56] References Cited

U.S. PATENT DOCUMENTS

| | | | |
|---|---|---|---|
| 3,258,707 | 6/1966 | Lawrence, Jr. | 250/214 AG |
| 3,349,319 | 10/1967 | Aiken . | |
| 3,521,645 | 9/1970 | De Jong . | |
| 4,137,428 | 1/1979 | Federico et al. | 301/117 |
| 4,410,764 | 10/1983 | Werth et al. | 381/108 |
| 4,434,325 | 2/1984 | Kobayashi et al. | 381/104 |
| 4,466,119 | 8/1984 | Peters et al. | 381/108 |
| 4,577,097 | 3/1986 | Keyes, IV et al. | 250/211 K |
| 4,700,060 | 10/1987 | Laiacona et al. . | |

Primary Examiner—Forester W. Isen
Attorney, Agent, or Firm—Warner, Norcross & Judd

[57] ABSTRACT

The specification discloses an audio signal level control system including a center-tapped photocell incorporated into an attenuator bridge. The cell elements are monitored while processing the audio signal, and a control circuit regulates the light-emitting device in the cell in response to the monitored bridge values. Preferably, log compression and filtering are performed within the control means. Also preferably, a tracking subtraction principle is used in both the audio and control paths to expand the control dynamic range.

32 Claims, 2 Drawing Sheets

CYBEROPTIC AUDIO LEVEL CONTROL SYSTEM

BACKGROUND OF THE INVENTION

The present invention relates to audio-level control systems for stereophonic equipment and more particularly to optically actuated audio-level control systems.

Stereophonic volume control, capable of keeping both channels tracking precisely in level, is extremely difficult. The most widely accepted technique includes straight mechanical control in the form of multi-carbon-mix, multi-tapered-element, multi-fingered-wiper dual potentiometers (pots). Such pots are becoming rather expensive and are not adaptable to remote control, except by the unrefined approach of using a small, remotely actuated DC motor to turn the pot.

Two forms of electrically controlled audio-level devices have been developed for higher-end equipment. The first uses digital switches (field-effect transistors or FETS) to select taps on an attenuator. Although these systems provide accurate channel tracking, they typically have course resolution. Further, these systems are prone to switching transients when moved, creating an audible "zipper noise". Third, interfacing such devices with conventional rotary control has proven difficult.

A second electrically controlled audio-level device includes a voltage-controlled amplifier (VCA) to use the fundamental current-splitting properties of bipolar transistor pairs. These circuits require meticulous device matching, distortion trimming, and thermal environment control. Manufacturing practicalities render such units impractical; and, therefore, audiophiles are often and rightly suspicious of such devices.

Optically actuated audio-level controls have also been designed as illustrated in U.S. Pat. No. 4,700,060 issued Oct. 13, 1987 to Laiacona et al entitled DEVICE FOR SELECTIVELY ROUTING AUDIO SIGNALS BIDIRECTIONALLY ALONG ONE OR TWO SIGNAL PATHS and U.S. Pat. No. 4,434,325 issued Feb. 28, 1984 to Kobayashi et al entitled VOLUME CONTROL FOR AN AUDIO APPARATUS. However, these systems are not suitable to precision level control because they are analogous to a potentiometer with a "loose knob". That is to say that their relation of resistance to LED excitation current is variable with at least production factors and operating temperatures.

SUMMARY OF THE INVENTION

The aforementioned problems are overcome in the present invention wherein an optically actuated audio-level control system monitors the actual cell elements to provide feedback and therefore precision tracking of the desired audio-level signal. The optical cell elements are measured while they are processing the audio signals using a matrix method including a center-tapped photo-resistor cell to provide a high degree of theoretical separation of the interrogation and audio quantities.

In a preferred aspect of the invention, a tracking subtraction principle is used in both the audio and measurement paths to expand the control dynamic range to needed values, while preserving the basic decibel (dB) to volt transfer properties.

Further preferably, log-stage compression is included inside the control loop to predict equal dB change per unit voltage and to compress the residual differential AC error term always present because of cell center-tap imbalance.

In yet another preferred aspect, the error integrator within the feedback loop includes a fast-tune system allowing the error loop to be extremely slow except when level change commands are being inputted.

In addition, automatic integration-rate balancing is preferably provided to compensate for production differences in the transfer efficiencies of the photo-modules.

These and other objects, advantages, and features of the invention will be more fully understood and appreciated by reference to the detailed description of the preferred embodiment and the drawings.

DETAILED DESCRIPTION OF THE PREFERRED EMBODIMENT

Figure 1:
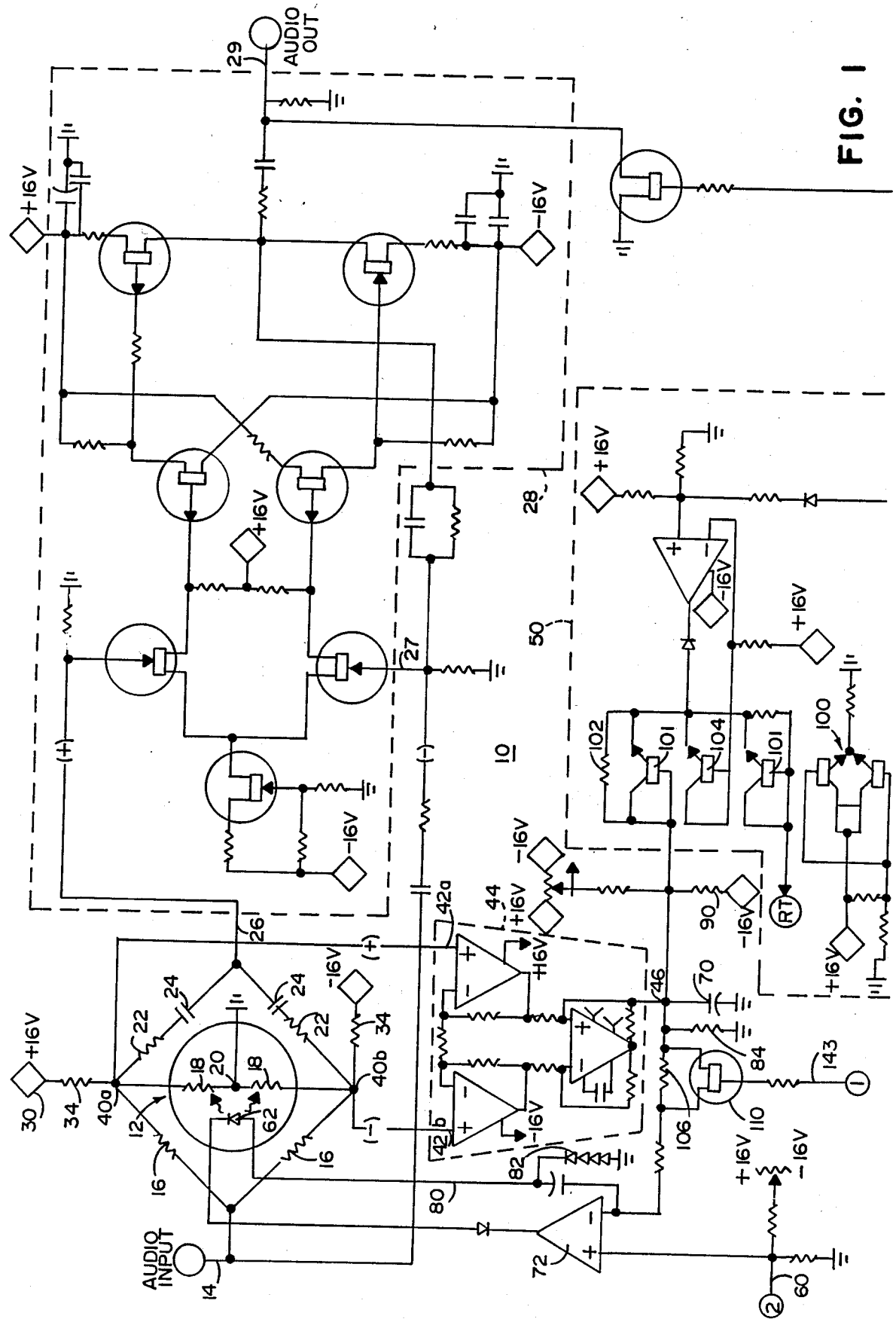
FIG. 1 is a schematic diagram of the present audio-level control system.

An optically actuated audio-level control system is illustrated in FIG. 1 and generally designated 10. The system utilizes a passive optical attenuator to effect volume and balance control. The system provides precision passive electrical level control, while eliminating the need for bipolar current-splitting methods (voltage-controlled amplifiers [VCA's]), digital step switches (multiplying digital-to-analog converters [DAC's]), and motor-driven potentiometers (pots).

I. Volume/Balance/Mute DC Circuit

Figure 2:
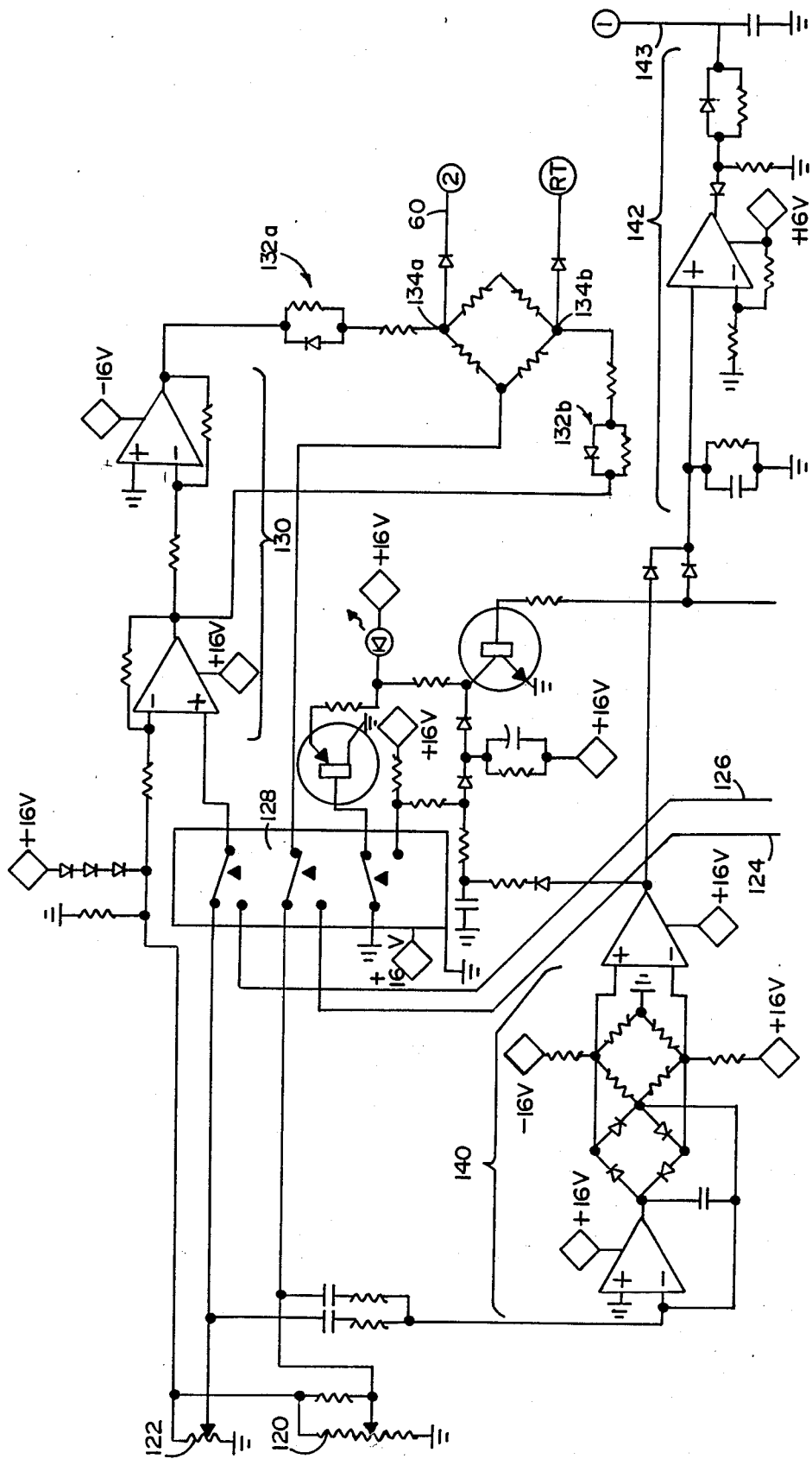
FIG. 2 is a schematic diagram of the volume/balance/mute DC circuit providing the input signals to the control system.

FIG. 2 illustrates the volume/balance/mute DC circuit for providing the control signals to the attenuator circuit. This FIG. 2 circuit is generally well-known to those having ordinary skill in the art and therefore will not be described in detail. The volume and balance commands are generated directly by two single-section linear pots 120 and 122, respectively, spanning zero volts to plus 14 volts in the panel mode. Alternatively, remote control signals can be applied from a DAC card (not shown) via lines 124 and 126, respectively, to the switch 128. One set of input signals is selected by the CD4053 3PDT CMOS switch 128.

The selected balance signal is sent through an LF353/TL082 dual op-amp 130 to level-shift to ground and produce its inverse. The balance signals are then shaped by diode/resistor networks 132a and 132b and mixed into the summing nodes 134a and 134b with the volume and mute signals. The system preferably provides a resolution of 0.1 dB per step in the remote mode and about 10 degrees pot rotation for each dB over the entire balance POT range of plus 3 to minus 15 dB. This method keeps one device totally in control of volume and the other, at reduced dB sensitivity, totally in control of balance to keep both channels servoed to the volume device regardless of any linearity or digitizing errors in the total system.

The disconnect diode 136 is provided to block any negative "over-sum" (below minus 90 dB) from entering the servo port. Although not unstable, such negative commands take the servo below the minus 90 dB limit and result in a slightly "bouncy" transient servo behavior as return is made to values just above minus 90 dB.

Another LF353/TL082 device 140 is included to sense any motion of the panel volume or balance. This device provides digital decisions to the latch 142 for quick and automatic transfer authority to the panel controls when either panel pot is turned. The digital command on line 143 is supplied to the "fast-tune" circuit 110 (see FIG. 1) for the servo systems.

II. Attenuator Circuit

A. Photo Module

The attenuator for each channel employs a center-tapped photo-resistor module 12 as the electrically variable attenuator element. In the preferred embodiment, a cadmium-sulfide (CdS) module or cell is utilized such as that sold as model CLM8500/2 by Clairex of Mt. Vernon, New York. Of course, virtually any equivalent cell could be similarly substituted. Such cells typically include resistive properties making them the most linear (or passive) electrically controllable resistor available. Practical resistance-control range is limited to about 1,000-to-1, or 60 dB. The transfer efficiencies of such cells are typically in a worst case spread of about minus 50 percent to plus 100 percent. Transfer efficiency relates to the amount of current required by the internal infrared (IR) light-emitting diode (LED) to produce a given photo-resistance value in the photoresistor module. The tracking between the center-tapped cells halves is within one to two dB even in the worst case.

In order to take advantage of the desired linear property, provision must be made for handling the other undesirable characteristics of the cell. In the present invention, the control range limitations are dealt with by using a subtractive signal process to extend the cell's dynamic control range; and the transfer efficiency, tracking, and temperature dependency limitations are dealt with through a feedback (servo) system to control the LEDs.

B. Attenuator Bridge

The audio signal is received in phase on line 14 and sent through two L-pad attenuators running side-by-side. The series resistor 16 of each pad is 150 k and the shunt elements 18 are the individual halves of the CdS cell with the center tap 20 being grounded. The audio output voltages across the two cell halves are directly summed through the resistors 22 and the capacitors 24 in each bridge half and fed directly to the positive input port 26 of the line amplifier 28 to produce an audio-out signal on line 29.

A small pair of direct current (DC) interrogation currents of opposite polarity are imposed on each cell half by coupling the positive voltage source 30 and the negative voltage source 32 through resistors 34. Each cell-half sees a theoretically identical in-phase audio signal, mixed with a positive DC signal on the top cell half and an equal negative DC signal on the bottom cell half. Changes in the brightness of the LED 40 will result in the differential "sum" of the two cell-drop DC voltages tracking linearly the direct sum of the two audio drops on the cell-halves. Consequently, this cell connection provides theoretically perfect separation of the audio and DC output signals by matrix methods if the cell is perfectly balanced around its center tap.

The central concept of the present invention is to measure the actual cell elements while they are processing the audio signals. The matrix method allows a high order of theoretical separation of the interrogation and audio components following the cell bridge.

III. Servo-Loop

The signals at nodes 40a and 40b are applied to the positive and negative input terminals 42a and 42b, respectively, of a classic three-op-amp instrumentation amp 44 designed for extremely low temperature and aging drift and modified to output positive current instead of voltage on line 46. The amp 44 includes a dual LM1458 and a single LM308.

The resulting current on line 46 is fed to a monolithic log converter 50 (to be described) servicing both stereo channels to convert the current to a voltage proportional to the log of the ratio of the measured current to a reference current. The desired audio-level signal for each channel is received on line 60. The log voltage (now equivalent to a dB measurement) on line 46 is prefiltered by capacitor 70 and compared to the incoming channel level command voltage on line 60 in an integrating servo amp 72. The servo amp runs at full open-loop DC gain and controls the current applied to the IR LED 62 so as to cause a voltage at line amp input 26 exactly matching the level command signal. Consequently, the DC servo completely corrects for all cell variations in terms of final settled attenuation value.

The symbol RT enclosed within a circle in FIG. 1 indicates an identical right channel connection.

A. Dynamic Rate Correction

The Miller integrator servo amp 72 is modified to derive its dynamic rate feedback via line 80 from a "rough" log of the LED current developed across four signal diodes 82 in series. This results in good channel-to-channel dynamic control-rate response matching without having to select cells of matched transfer efficiency for the two stereo channels.

A log "damper" resistor 84 is included to place an upper shelf on servo gain as the log stage goes to very high gain at low currents to minimize servo bounce at deep attenuation. Although this resistor produces a minor aberration in log conformity, or dB/volt transfer properties, the aberration is not significant for purposes of the system. This damper resistor 84 also cooperates as a voltage divider with the resistors 102 which are placed in parallel with the channel logging trans-diodes.

B. Dynamic Control Range Extension

A small subtractive alternating current (AC) plateau is also fed to the inverting input port 27 of the line amp 28 to allow the single-stage L-pad attenuator to have a dynamic control range extending much deeper than the basic cell can provide. This AC effect is compensated by subtraction of a matching DC quantity using resistor 90 in the log path to maintain log (dB/volt) conformity.

Thus, another important aspect of the present invention is the use of the tracking subtraction principle in both the audio and measurement paths to expand the control dynamic range while preserving the basic dB/volt transfer properties.

C. Fast-Tune Signal

Inevitably, the photo-resistor cell will never be perfectly center-tapped. Consequently, a small uncanceled AC component will be injected into the DC servo path through the amplifier 44. The above described logging process greatly suppresses the AC component at higher volume settings. However, the suppression is significantly less at lower volume settings.

To further minimize intermodulation (IM) distortion resulting from this AC component, an extremely long time-constant is provided in the servo integrator by way of the resistor 106 when no command level changes are occurring. When the "fast-tune" signal is generated and received on line 143, the servo integrator 110 is sped up by a factor of about one hundred (100) times by short-circuiting the resistor 106 using a J112 JFET switch in each servo channel. This arrangement causes rapid entry of all level-change instructions.

D. Drift Correction

A log stage is included in the control path (1) to convert the inherently linear properties of an economic 8-bit DAC (equal step size per bit) to an exponential audio format and (2) to permit use of economic multi-sourced linear pots on the panel and the remote unit. The present invention incorporates the logging process inside the servo loop for two reasons. First, placing the log "compressor" inside the loop causes the theoretic integration rate or "forcing quantity" to be proportional to dB error and not linear gain error. Thus, a mathematic model of such a system predicts equal dB change per unit time. Second, the log stage is extremely effective in compressing the residual differential AC error term always present because of slight cell center-tap imbalance.

As the monolithic logger 50 warms up, the difference in junction voltage (trans-diode) drop between the channel loggers 101 and the reference logger 104 increases at 0.3 percent per degree C. At deepest attenuation (about minus 90 dB), the channel logger current is well below the log reference current. Thus, the channel junctions are dropping (about 100 mV) less potential than the log reference junction. As temperature increases, the potential drop on the reference junction will drop at 1.9 mV per degree C.; and the channel logging junction drops will go down more than 1.9 mV per degree C.

Since the log reference servo amplifier holds the log reference collector at fixed potential, the tied emitters will result in a net negative logging error appearing at the channel logger collectors. This error is about minus 300 microvolts per degree C. at deep attenuation, causing the servos to call up higher photo-module DC levels to offset this error. Such results in higher audio-levels than the desired deep attenuation.

The resistors 102 allow the log-reference transdiode to also act as an on-chip "thermometer", injecting a small thermally derived voltage correction of just the right magnitude into the two channel log control paths to maintain near perfect thermal stability of the critical deep attenuation region. The resistors 102 paralleling the channel loggers 101 inject the needed percentage (about 1/6 of the positive going) (emitter) 1.9 mV per degree C. into both channel-logging paths, canceling the temperature-proportional, negative-going drift of the collectors of the channel loggers.

Logging pairs always show an expansion of differential junction-potential drop with increasing temperature. However, being inside the control loop, this behavior yields a small proportional audio control range compression with increasing array temperature. This effect is of little practical consequence except at the very deep attenuations where the aforedescribed subtraction mechanism is highly operative.

At deep attenuation, correction of this indigenous logger drift is essential to maintain a thermally stable value of deep attenuation. Heating the chip quickly provides an acceptable operating temperature even in extremely cold turn-ons. However, heating does not remove the deep attenuation drift described above.

Temperature correction is provided in the monolithic log stage in two forms. First, a log heater 100 comprising two extra transistors in the array brings the system to stable operating temperature quickly. Second, a small "thermometer" quantity of the array's base-to-emitter drop (varying at minus 1.9 mV/degree C.) is injected into the loggers by the resistors 102 connected between the base and emitter.

The aforedescribed drift collection is important in making the subtractive technique practical for deep attenuation. the correction intrinsically measures the chip temperature and does not have to rely on any extrinsic thermal compensation devices.

IV. Conclusion

Attached as Appendices 1 and 2 are copies of FIGS. 1 and 2, respectively, with component values or identifications set forth for all devices to set forth the best mode contemplated of carrying out the invention.

The optically actuated audio-level control system of the present invention provides precision control of the audio-levels without expensive pots and without the noted disadvantages of other electrically actuated control systems. In particular, the described system enables monitoring of the actual audio-level without significantly effecting that level in a manner necessary to provide closed loop control. The present invention is particularly well suited to and adaptable with remote control.

The above description is that of a preferred embodiment of the invention. Various alterations and changes can be made without departing from the spirit and broader aspects of the invention as defined in the appended claims, which are to be interpreted in accordance with the principles of patent law including the doctrine of equivalents.

The embodiments of the invention in which an exclusive property or privilege is claimed are defined as follows:

1. An audio level control system comprising:
   means for receiving an audio signal;
   attenuator means for controllably attenuating said audio signal to produce an attenuated audio signal, said attenuating means including means for receiving a control signal, said attenuating means further including a center-tapped photocell;
   means for producing a detection signal indicative of the level of said attenuated audio signal;
   means for receiving a command level signal; and
   means for producing a control signal as a function of the command level signal and the detection signal, the control signal being applied to the control signal receiving means of said attenuator means.

2. An audio level control system as defined in claim 1 wherein said detection signal producing means includes means for log compressing the detection signal.

3. An audio level control system as defined in claim 1 wherein said attenuating means includes an attenuator bridge incorporating said center-tapped photocell.

4. An audio level control system as defined in claim 3 further comprising means for injecting interrogation currents into both halves of said cell; and wherein said detection signal producing means includes means for measuring the voltage on each of the cell halves.

5. An audio level control system as defined in claim 1 wherein said detection signal producing means includes means for time filtering the detection signal.

6. An audio level control system as defined in claim 5 wherein said time filtering means includes means for shortening the time constant when the command level signal is changing.

7. An electrical signal level control system comprising:
an optically actuated attenuator means for attenuating an electrical signal to produce an attenuated electrical signal, said attenuator means including a center-tapped photocell and an attenuator bridge incorporating said photocell; and
control means for controlling said optically actuated attenuator means as a function of actual attenuation and a command level signal.

8. A signal level control system as defined in claim 7 wherein said control means includes interrogation means for injecting interrogation currents into both halves of said cell.

9. A signal level control system as defined in claim 8 wherein said control means further includes detector means for producing a detection signal as a function of the voltages at the cell halves.

10. An electrical signal level control system comprising:
controllable attenuator means for attenuating an electrical signal to produce an attenuated electrical signal, said attenuator means including a center-tapped photocell;
command level means for producing a command level signal indicative of a desired attenuation; and
control means for controlling said controllable attenuator means, said control means being responsive to said attenuator means and the command level signal.

11. A control system as defined in claim 10 wherein said attenuator means further comprises an attenuator bridge incorporating said photocell.

12. A control system as defined in claim 11 wherein said control means includes:
interrogation means for adding an interrogation current to each half of the cell half; and
detector means for detecting the voltage at each cell half.

13. A control system as defined in claim 10 wherein said control means includes logger means for log compressing a signal within said control means.

14. A control system as defined in claim 10 wherein said control means includes filter means for time filtering a control signal within said control means.

15. A control system as defined in claim 14 wherein said filter means includes means for altering said time constant when the command level signal is changing.

16. An electrical signal level control system comprising:
an optically actuated attenuator means for attenuating an electrical signal to produce an attenuated electrical signal; and
control means for controlling said optically actuated attenuator means as a function of actual attenuation and a command level signal, said control means including log means for log compressing a control signal within said control means.

17. An audio level control system comprising:
an optically actuated, center-tapped cell;
an attenuator bridge including two halves and incorporating said center-tapped cell and having an input port for receiving an audio signal and an output port for outputting an attentuated audio signal;
interrogation means for introducing an interrogation current into each said half of said attenuator bridge;
detector means for producing a detection signal as a function of the voltages at each said half of the attenuator bridge; and
control means for controlling said optically actuated, center-tapped cell as a function of the detection signal and a command level signal.

18. An audio level control system as defined in claim 17 wherein said control means includes logger means for log compressing the detection signal.

19. An audio level control system as defined in claim 17 wherein said control means includes filter means for time filtering the detection signal.

20. An audio level control system as defined in claim 19 wherein said filter means includes means for altering the time constant of said filter means when the command level signal is changing.

21. An audio level control system as defined in claim 17 further comprising subtractor means for subtracting a signal from the attenuated audio signal and the detection signal to expand the dynamic range of the control means.

22. An audio level control system comprising:
means for receiving an audio signal;
attenuator means for controllably attenuating said audio signal to produce an attenuated audio signal, said attenuating means including means for receiving a control signal;
means for producing a detection signal indicative of the level of said attenuated audio signal;
means for receiving a command level signal;
means for producing a control signal as a function of the command level signal and the detection signal, the control signal being applied to the control signal receiving means of said attenuator means; and
means for performing a tracking subtraction on both the attentuated audio signal and the detection signal.

23. An audio level control system as defined in claim 22 wherein said detection signal producing means includes means for log compressing the detection signal.

24. An audio level control system as defined in claim 22 wherein the detection signal producing means includes means for time filtering the detection signal.

25. An audio level control system as defined in claim 24 wherein said time filtering means includes means for shortening the time constant when the command level signal is changing.

26. An electrical signal level control system comprising:
an optically actuated attenuator means for attenuating an electrical signal to produce an attenuated electrical signal;
control means for controlling said optically actuated attenuator means as a function of actual attenuation and a command level signal; and
subtractor means for subtracting a signal from the attenuated electrical signal and a control signal within said control means to expand the dynamic range of the control means.

27. An electrical signal level control system comprising:
an optically actuated attenuator means for attenuating an electrical signal to produce an attenuated electrical signal, said attenuator means including a center-tapped photocell; and
control means for controlling said optically actuated attenuator means as a function of actual attenuation and a command level signal, said control means including filter means for time averaging a control signal within said control means to suppress transients.

28. A signal level control system as defined in claim 27 wherein said filter means includes means for changing the time constant thereof when the command level signal is changing.

29. An electrical signal level control system comprising:
controllable attenuator means for attenuating an electrical signal to produce an attenuated electrical signal;
command level means for producing a command level signal indicative of a desired attenuation;
control means for controlling said controllable attenuator means, said control means being responsive to said attenuator means and the command level signal; and
subtractor means for subtracting a signal from the attentuated electrical signal and a control signal within the control means to expand the dynamic range of the control means.

30. A control system as defined in claim 29 wherein said control means includes logger means for log compressing a signal within said control means.

31. A control system as defined in claim 29 wherein said control means includes filter means for time filtering a control signal within said control means.

32. A control system as defined in claim 31 wherein said filter means includes means for altering a time constant of said filter means when the command level signal is changing.

* * * * *

UNITED STATES PATENT AND TRADEMARK OFFICE
CERTIFICATE OF CORRECTION

PATENT NO. : 4,905,291

DATED : February 27, 1990

INVENTOR(S) : James C. Strickland

It is certified that error appears in the above-identified patent and that said Letters Patent is hereby corrected as shown below:

Column 6, Claim 6, Line 67:
  delete first occurrence of "the" and insert --its--

Column 7, Claim 12, Line 38:
  delete second occurrence of "half"

Signed and Sealed this

Sixteenth Day of July, 1991

Attest:

HARRY F. MANBECK, JR.

*Attesting Officer*      *Commissioner of Patents and Trademarks*